United States Patent
Shako et al.

(10) Patent No.: US 8,565,697 B2
(45) Date of Patent: Oct. 22, 2013

(54) DISTORTION COMPENSATION APPARATUS AND METHOD

(75) Inventors: Hideharu Shako, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 423 days.

(21) Appl. No.: 12/691,036

(22) Filed: Jan. 21, 2010

(65) Prior Publication Data

US 2010/0117729 A1    May 13, 2010

Related U.S. Application Data

(63) Continuation of application No. PCT/JP2007/000824, filed on Jul. 31, 2007.

(51) Int. Cl.
*H04B 1/04* (2006.01)
*H04K 3/00* (2006.01)

(52) U.S. Cl.
USPC ............... 455/114.3; 455/126; 455/127.1; 375/296

(58) Field of Classification Search
USPC ........... 455/114.3, 126, 127.1; 375/296–297
See application file for complete search history.

(56) References Cited

U.S. PATENT DOCUMENTS

| 6,240,144 | B1 | 5/2001 | Ha |
| 6,507,731 | B1* | 1/2003 | Hasegawa ............. 455/115.3 |
| 6,859,099 | B2 | 2/2005 | Akaiwa |
| 7,012,969 | B2 | 3/2006 | Ode et al. |
| 7,551,687 | B2 | 6/2009 | Ode et al. |
| 7,590,190 | B2* | 9/2009 | Luke et al. ............. 375/297 |
| 2001/0007435 | A1 | 7/2001 | Ode et al. |
| 2004/0032296 | A1 | 2/2004 | Akaiwa |
| 2005/0105642 | A1 | 5/2005 | Muller et al. |
| 2005/0111574 | A1 | 5/2005 | Muller et al. |
| 2005/0226346 | A1 | 10/2005 | Ode et al. |
| 2006/0098758 | A1 | 5/2006 | Luke et al. |

FOREIGN PATENT DOCUMENTS

| EP | 1335489 A1 | 8/2003 |
| JP | 08251246 | 9/1996 |
| JP | 10322137 | 12/1998 |
| JP | 2001251148 | 9/2001 |

(Continued)

OTHER PUBLICATIONS

European Communication dated Mar. 29, 2011 for application No. 07790314.4-2215.

(Continued)

*Primary Examiner* — Lee Nguyen
(74) *Attorney, Agent, or Firm* — Smith, Gambrell & Russell, LLP

(57) ABSTRACT

A distortion compensation apparatus having a circuit configured to perform power amplification of a transmission signal; and a circuit configured to feedback the transmission signal output from the circuit configured to perform power amplification and obtain a demodulated signal of the transmission signal, while calculating and holding a distortion compensation coefficient with which an error between the demodulated signal and the transmission signal before the power amplification becomes minimum, to perform distortion compensation of the transmission signal based on the distortion compensation coefficient and provide the compensated transmission signal to the circuit configured to perform the power amplification, the distortion compensation apparatus includes: a gain adjustment unit to adjust a gain of the transmission signal; and a gain control unit to adaptively adjust a gain of the gain adjustment unit based on the held distortion compensation coefficient.

10 Claims, 9 Drawing Sheets

(56) References Cited

FOREIGN PATENT DOCUMENTS

| | | |
|---|---|---|
| JP | 200294335 | 3/2002 |
| JP | 2002522989 | 7/2002 |
| JP | 2004032252 | 1/2004 |
| JP | 2005110284 | 4/2005 |
| JP | 2006270797 | 10/2006 |
| WO | 0105026 A1 | 1/2001 |

OTHER PUBLICATIONS

International Search Report dated Nov. 6, 2007 based on International Application No. PCT/JP2007/000824.
Chinese Office Action dated Dec. 23, 2011 issued in application No. 200780100017.2.

* cited by examiner

US 8,565,697 B2

DISTORTION COMPENSATION APPARATUS AND METHOD

CROSS-REFERENCE TO RELATED APPLICATIONS

This application is a continuation of international application PCT/JP2007/000824, which was filed on Jul. 31, 2007, the entire contents of which are incorporated herein by reference.

FIELD

The present invention relates to an adaptive pre-distorter type distortion compensation technique to compensate for a non-linear distortion in a power amplifier of a radio transmission apparatus.

BACKGROUND

Generally, a high-efficient power amplifier used for a radio transmission apparatus such as a mobile base station has a strong nonlinear characteristic. Thus, when a modulated signal for high-speed radio communication is transmitted, the nonlinear distortion in such a power amplifier generates an out-of-band emission power in the modulated transmission signal, affecting an adjacent transmission channel.

A known system for suppressing the out-of-band emission of a power amplifier is the pre-distorter system in which an input signal is multiplied by a distortion signal having a reverse characteristic of the nonlinear characteristic of the power amplifier and before the input signal is provided to the power amplifier, to compensate for the nonlinear distortion. Particularly, with the adaptive pre-distorter system in which the distortion compensation is performed adaptively by feeding back the output of the power amplifier to the input side, the out-of-band emission can be suppressed significantly. Furthermore, a digital pre-distorter system has a look-up table storing a distortion compensation coefficient to be used for multiplication between the distortion signal with a reverse characteristics and the input signal. In the digital pre-distorter system, the output of the power amplifier is fed back to update the distortion compensation coefficient in the lookup table adaptively, the circuit configuration for the distortion compensation can be simplified (for example, Japanese National Publication of International Patent Application No. 2002-522989).

FIG. 1 illustrates a conventional configuration of an adaptive pre-distorter type distortion compensation apparatus that uses a lookup table.

In FIG. 1, an address generation unit 101 obtains an address value by calculating an input level from an orthogonal baseband input signal X(I,Q) input to the distortion compensation circuit, and reads out, from a lookup table (LUT) 102, a distortion compensation coefficient corresponding to the generated address value.

A multiplier 103 performs distortion compensation by multiplying input signal X(I,Q) by the distortion compensation coefficient that was read out from the LUT 102. The output of the multiplier 103 is converted into an analog signal in a D/A converter 104, and further, subjected to orthogonal modulation by a signal oscillated by a local oscillator (FW LOCAL) according to the transmission base station, in an orthogonal modulator (QMOD) 105.

The analog transmission signal that has been modulated is subjected to power amplification in a power amplifier 107, and its output is supplied to a transmission antenna that is not particularly illustrated in the drawing through a coupler (DC) 108, and transmitted from the antenna. The output of the power amplifier 107 is fed back via the DC 108 to the input side.

First, the output of the DC 108 is down-converted by a down converter (MIX) 109 using a signal oscillated from a local oscillator (FW LOCAL) 110 according to the transmission base station, and after conversion into a digital signal by an A/D converter 111, the signal is further converted into the baseband signal by a demodulator (DEM) 112.

For the feedback signal obtained as a result, the error with the input signal X(I,Q) that has been delayed by a delay circuit 114 is calculated by a subtracter 113, and the distortion compensation coefficient in the LUT 102 is updated by a Least Mean Square calculation circuit (LMS) 115 so as to minimize the error.

A central processing unit (CPU) 116 controls the update operation of the distortion compensation coefficient in the LUT 102, and the like.

The distortion compensation coefficient is gradually converged into a certain value and the converged distortion compensation coefficient is multiplied by the input signal X(I,Q) in the multiplier 103. Thus, in the steady state, the nonlinear distortion characteristic of the analog circuit portion is suppressed with good accuracy while maintaining high power efficiency.

As described above, the gain variation in the analog circuit portion of the forward (FW) system can be compensated by the amplitude value of the distortion compensation coefficient held in the LUT 102. Then, even when the gain of the FW system varies due to an influence from temperature or frequency, the analog gain variation amount is detected by the feedback signal and the value of the distortion compensation coefficient is updated in the direction to compensate for the variation amount, making it possible to correct the gain variation amount due to the temperature or frequency characteristics and the like of the analog circuit portion, at the same time with the distortion compensation.

However, since the gain value that can be compensated by the distortion compensation coefficient is limited, when the variation amount of the gain in the analog circuit due to temperature or frequency is large, it exceeds the range of the correction available by the distortion compensation coefficient. There has been a problem that when the variation amount exceeds the correction range, not only the distortion-compensation operation capability that is the original purpose deteriorates, but also the transmission output level becomes abnormal.

Therefore, there has been a conventional art as illustrated in FIG. 2 in which a variable attenuator (VATT) 201 for compensating for the gain variation of the FW system is disposed in the analogue circuit, and the variation amount is suppressed by performing the gain setting according to the temperature or frequency.

However, in this conventional art, a table for correcting the temperature and/or frequency is required. With the correction table reference configuration, the conventional art has problems such as that it is susceptible to the circuit variability; a non-volatile memory 204 for storing the correction value is required; and a temperature monitoring circuit 203 is required.

A method of adjusting the gain of a transmission signal in accordance with the amount of the distortion power of the transmission signal has been proposed (for example, Japanese Laid-open Patent Publication No. 2006-270797).

A system in which the amplitude of the distortion compensation coefficient is corrected in advance so that the transmission signal after the distortion compensation does not exceed the dynamic range of the D/A converter while maintaining the phase of the coefficient has been proposed (for example, Japanese Laid-open Patent Publication No. 2001-251148).

A method of adjusting the gain of a transmission signal so that the dynamic range of the D/A converter can be used to the maximum has been proposed (for example, Japanese Laid-open Patent Publication No. 2004-32252).

SUMMARY

One aspect of the invention is a distortion compensation apparatus having a circuit configured to perform power amplification of a transmission signal; and a circuit configured to feedback the transmission signal output from the circuit configured to perform power amplification and obtain a demodulated signal of the transmission signal, while calculating and holding a distortion compensation coefficient with which an error between the demodulated signal and the transmission signal before the power amplification becomes minimum, to perform distortion compensation of the transmission signal based on the distortion compensation coefficient and provide the compensated transmission signal to the circuit configured to perform the power amplification. The distortion compensation apparatus includes: a gain adjustment unit to adjust a gain of the transmission signal; and a gain control unit to adaptively adjust a gain of the gain adjustment unit based on the held distortion compensation coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
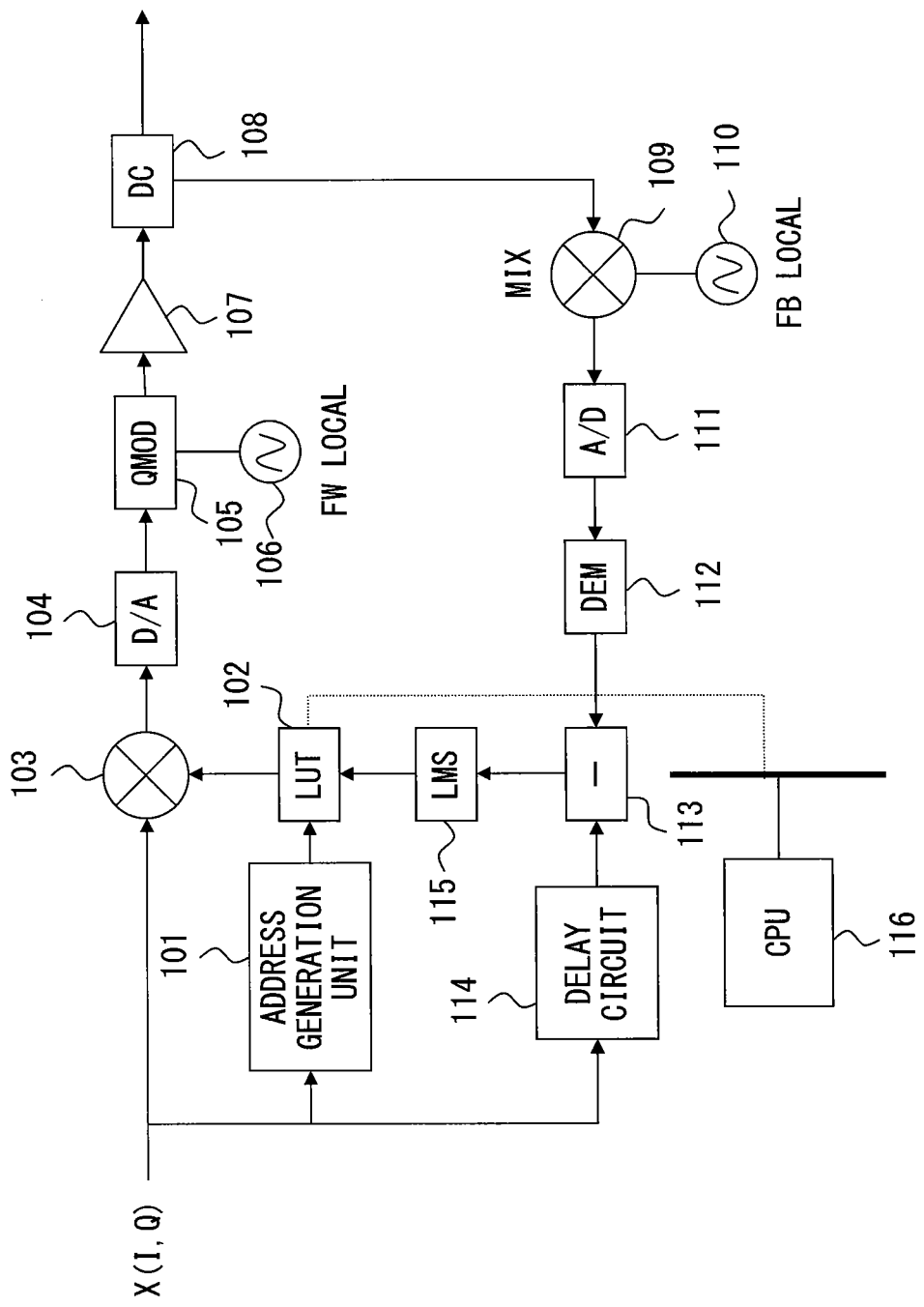
FIG. 1 is a diagram of a conventional configuration of an adaptive pre-distorter type distortion compensation apparatus that uses a lookup table.
Figure 2:
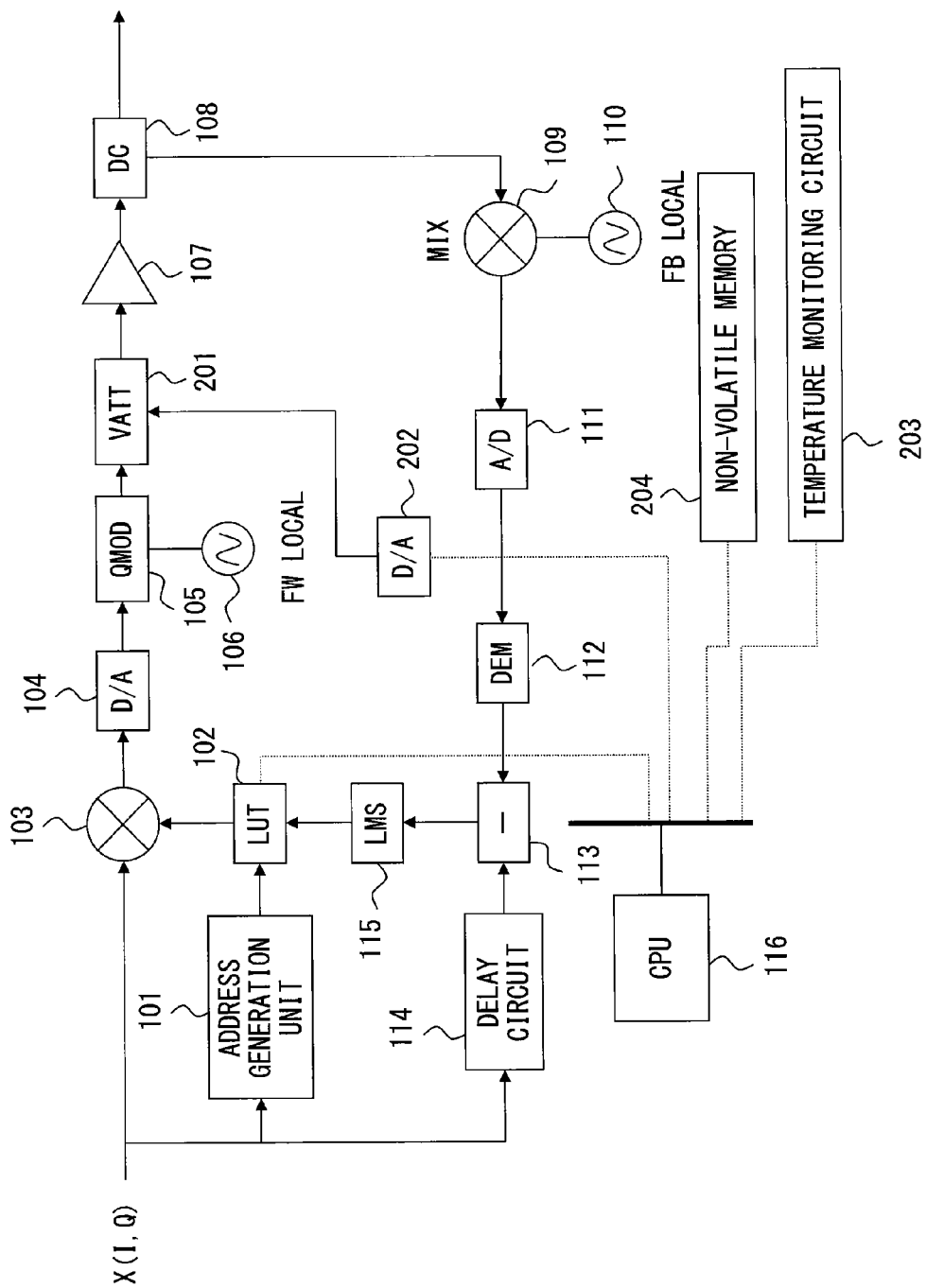
FIG. 2 is a diagram of a conventional configuration of an adaptive pre-distorter type distortion compensation apparatus that uses a lookup table for correcting the gain variation of the analog circuit portion.
Figure 3:
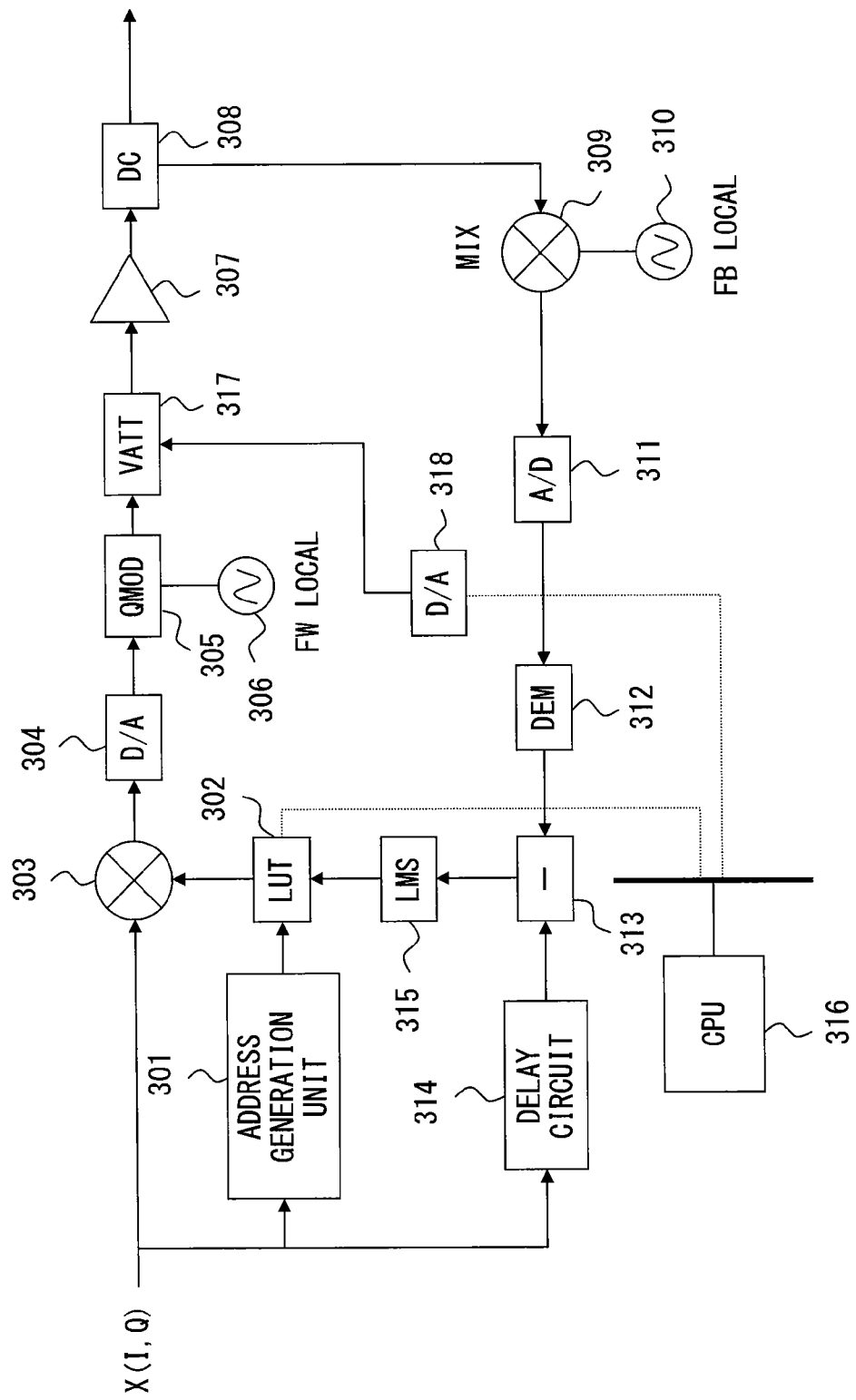
FIG. 3 is a configuration diagram of the first through third embodiments.

FIG. 3 is a configuration diagram of the first embodiment. The configuration of the second and third embodiments described later is the same.

In FIG. 3, an address generation unit 301 obtains an address value by calculating an input level $P(I^2+Q^2)$ from an orthogonal baseband input signal $X(I,Q)$ input to the distortion compensation circuit, and reads out, from a lookup table (LUT) 302, a distortion compensation coefficient corresponding to the generated address value. Since the distortion amount in the analog circuit portion varies in accordance with the signal level there, the optimal distortion compensation coefficient is read out from the LUT 302 by supplying the input level corresponding to the signal level to the address generation unit 301.

A multiplier 303 performs distortion compensation by multiplying the input signal $X(I,Q)$ by the distortion compensation coefficient that has been read out from the LUT 302.

The output of the multiplier 303 is converted into an analog signal by a D/A converter 304. Then the analog signal is modulated in orthogonal modulation by a signal oscillated from a local oscillator (FW LOCAL) 306 according to the transmission base station, in an orthogonal modulator (QMOD) 305.

The gain amount of the transmission analog signal corresponding to the change of the temperature and/or frequency of the analog circuit portion is adjusted in a variable attenuator (VATT) 317 controlled by a CPU 316 through a D/A converter 318. Then the transmission analog signal is subjected to power amplification by a power amplifier 307. The output of the power amplifier 307 is supplied to a transmission antenna that is not particularly illustrated in the drawing through a coupler (DC) 308, and transmitted from the antenna.

The output of the power amplifier 307 is fed back via the DC 308 to the input side.

First, the output of the DC 308 is down-converted by a down converter (MIX) 309 using a signal oscillated from a local oscillator (FW LOCAL) 310 according to the transmission base station. Then the output of the down converter 309 is converted into a digital signal by an A/D converter 311, and further converted into the baseband signal by a demodulator (DEM) 312.

For the feedback signal obtained as a result, an error with the input signal $X(I,Q)$ that has been delayed by a delay circuit 314 is calculated in a subtracter 313. The distortion compensation coefficient in the LUT 302 is updated by a Least Mean Square calculation circuit (LMS) 315 so as to minimize the error, in accordance with the following equation. In the following equation, "h" is the distortion compensation coefficient, "μ" is the step size parameter (correction coefficient), and "e" is the output signal (error signal) of the subtracter 313.

$$h_n = h_{n-1} - \mu e$$

(μ<<1, e is the error vector)

A central processing unit (CPU) 316 controls the update operation of the distortion compensation coefficient in the LUT 302. In addition, the CPU 316 calculates the control voltage of the VATT 317 by monitoring the coefficient in the LUT 302 regardless of the parameters such as the frequency, temperature and the like of the analog circuit portion, and provides the control voltage to the VATT 317 through the D/A converter 318, to realize the correction of the gain variation amount of the analog circuit portion.

Figure 4:
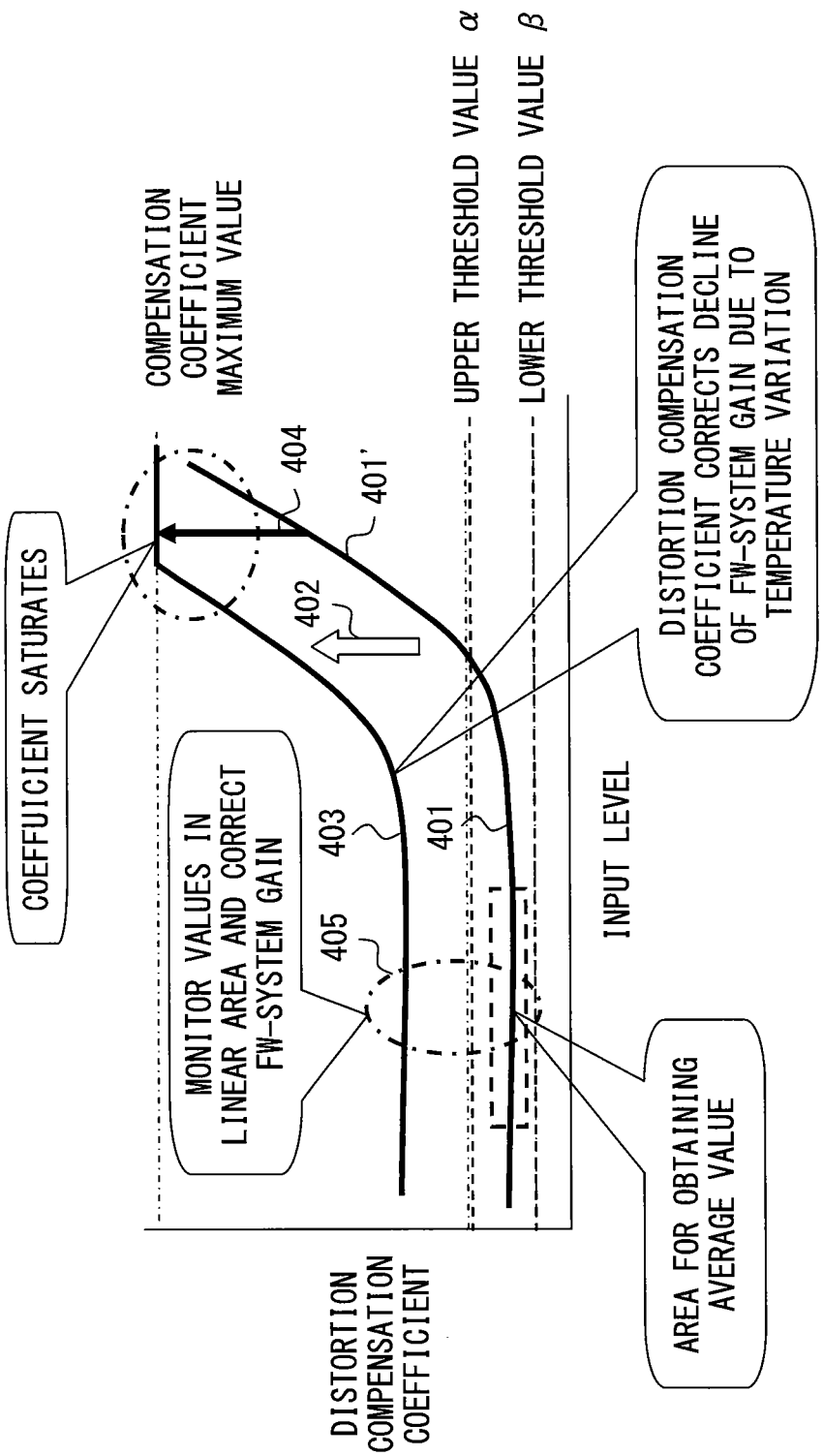
FIG. 4 is a diagram illustrating the operation of the first embodiment.

FIG. 4 is a diagram illustrating the operation of the first embodiment having the configuration described above.

With the repetition of the update of the distortion correction coefficient in the LUT 302 by the adaptive pre-distortion, the optimal distortion compensation characteristic illustrated as 401 in FIG. 4 can be obtained, in a steady state. In the characteristic, in the area with high input signal levels, the gain decreases due to the saturation of the power amplifier 307. Thus, in order to compensate for it, the distortion compensation coefficient becomes a large value as illustrated as 401' in FIG. 4.

Here, when the analog gain decreases due to the temperature variation, frequency variation and the like in the analog circuit portion, the overall distortion compensation coefficients move towards the direction of larger values as illustrated as 402 of FIG. 4, and the distortion compensation characteristic shifts to the one as illustrated as 403 of FIG. 4.

In this case, at a point with a high input signal level, the value of the distortion compensation coefficient becomes stuck to the maximum value as illustrated as 404 in FIG. 4, making it impossible to perform an appropriate distortion compensation operation. In order to prevent this, the following operation is performed in the first embodiment.

As a characteristic of the power amplifier 307, in the area with a low input signal level, a linear characteristic is obtained, since the gain decrease is relatively small. The distortion compensation coefficients in the linear area vary with an influence from analog gain variation due to the temperature and/or frequency.

Therefore, the CPU 316 monitors, in the LUT 302, the average value of the distortion correction coefficient values in the linear area illustrated as 405 in FIG. 4, and calculates the control voltage to be supplied to the VATT 317 through the D/A converter 318, so that the average value falls within the set range between an upper-limit threshold value α and a lower-limit threshold value β.

As a result, the analog gain amount input to the power amplifier 307 is adjusted by the VATT 317, and the distortion compensation characteristic can be maintained as the characteristic illustrated as 401 in FIG. 4 without referring to the table having the temperature, frequency and the like as parameters. Therefore, a good distortion compensation characteristic can be obtained in the area with high input signal levels illustrated as 401' in FIG. 4.

Figure 5:
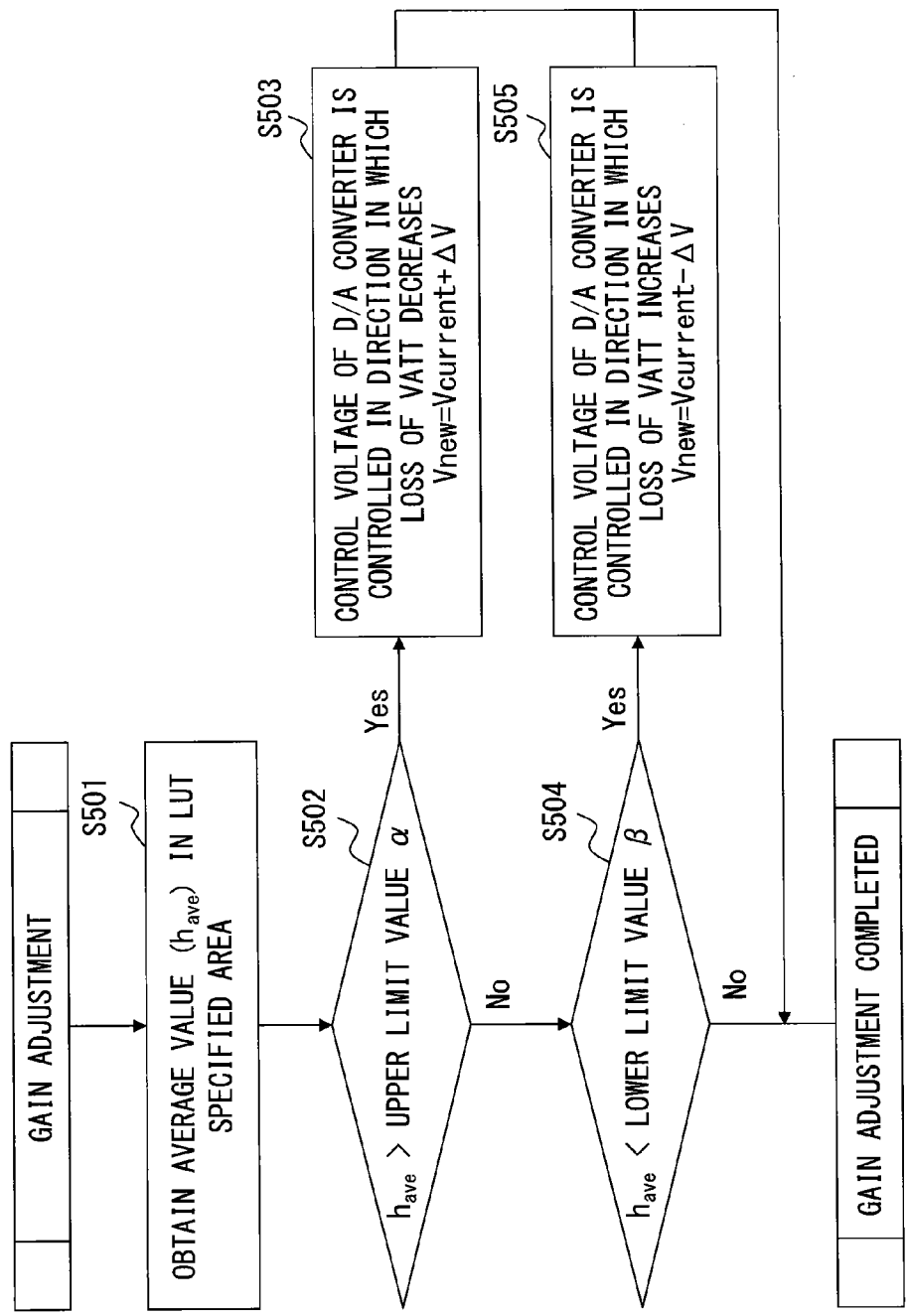
FIG. 5 is an operation flowchart of the first embodiment.

FIG. 5 is an operation flowchart of a program executed by the CPU 316 in FIG. 3 to realize the above operation in the first embodiment.

First, the CPU 316 reads out, from the LUT 302, distortion compensation coefficient data in the address range corresponding to a specified linear area illustrated as 405 in FIG. 4, and obtains the average value $h_{ave}$ in the range (S501).

Next, the CPU 316 performs a comparison to determine whether the obtained average value $h_{ave}$ is larger than the upper limit α or not (S502).

If the result of the judgment in S502 is YES ($h_{ave} > α$), the CPU 316 determines that the analog gain is decreasing. In this case, the CPU 316 calculates, as the control voltage to be supplied to the D/A converter 318 in FIG. 3, a new control voltage $V_{new}$ by adding a specified variation amount ΔV to the current control voltage $V_{current}$ and supplies the new control voltage $V_{new}$ to the D/A converter 318. That is, the CPU 316 controls the control voltage in the direction in which the gain of the VATT 317 in FIG. 3 increases (the attenuation amount decreases) (S503). Then the current gain adjustment process is terminated.

If the result of the judgment in S502 is NO ($h_{ave} \le α$), the CPU 316 performs a comparison to determine whether the obtained average value $h_{ave}$ is smaller than the lower limit β or not (S504).

If the result of the judgment in S504 is YES ($h_{ave} < β$), the CPU 316 determines that the analog gain is too high. In this case, the CPU 316 calculates, as the control voltage to be supplied to the D/A converter 318 in FIG. 3, the new control voltage $V_{new}$ by subtracting the specified variation amount ΔV from the current control voltage $V_{current}$ and supplies the new control voltage $V_{new}$ to the D/A converter 318. That is, the CPU 316 controls the control voltage in the direction in which the gain of the VATT 317 in FIG. 3 decreases (the attenuation amount increases) (S505). Then the current gain adjustment process is terminated.

If the result of the judgment in S504 is NO ($h_{ave} \ge β$), the CPU 316 determines that the analog gain is appropriate. In this case, the CPU 316 terminates the current gain adjustment process without changing the control voltage.

In the above operation, in order to avoid the spread of the spectrum due to a rapid change of the transmission output, the variation amount ΔV for the control voltage may be set as, for example, a value corresponding to a transmission output of about 0.1 dB.

As the timing to perform the control operation described above, while it depends on the intervals at which the temperature, frequency and the like of the analog circuit portion vary and the variation amount ΔV for the control voltage, it may be performed at intervals of several tens of seconds to several minutes.

Second Embodiment

The second embodiment has the configuration illustrated in FIG. 3 that is the same as that of the first embodiment.

Figure 6:
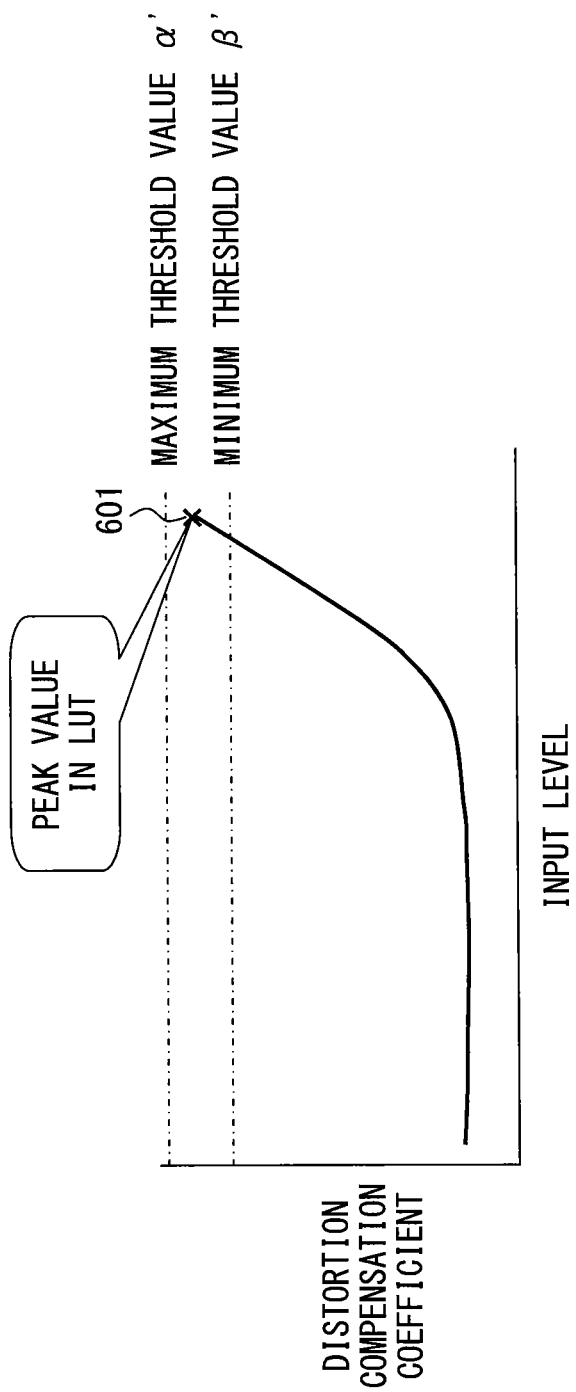
FIG. 6 is a diagram illustrating the operation of the second embodiment.

In the second embodiment, it is assumed that a distortion compensation characteristic as described in FIG. 4 for the first embodiment used. The CPU 316 monitors, in the LUT 302, not the average value of the distortion compensation coefficient values in the linear area illustrated as 405 in FIG. 4 but the maximum value of the distortion compensation coefficient values illustrated as 601 in FIG. 6. Then the CPU 316 calculates the control voltage to be supplied to the VATT 317 through the D/A converter 318, so that the maximum value falls within the set range between the upper-limit threshold value α' and the lower-limit threshold value β'.

As a result, in a similar manner as in the first embodiment, the analog gain amount input to the power amplifier 307 is adjusted by the VATT 317, and the distortion compensation characteristic can be maintained as the characteristic illustrated as 401 in FIG. 4 without referring to the table with parameters with respect to temperature, frequency and the like. Thus, a good distortion characteristic can be obtained even in the area with high input signal level illustrated as 401' in FIG. 4.

Figure 7:
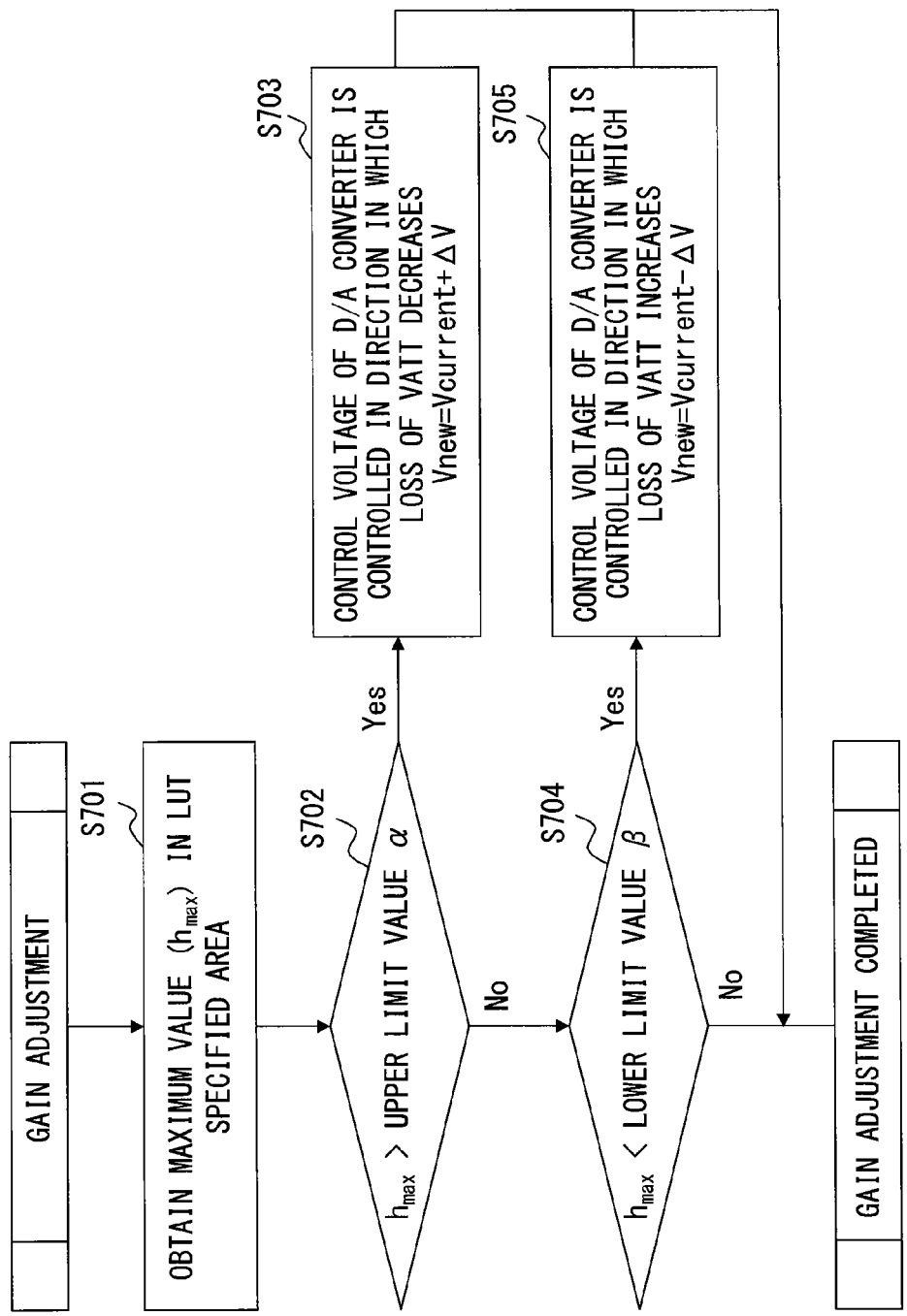
FIG. 7 is an operation flowchart of the second embodiment.

FIG. 7 is an operation flowchart of a program executed by the CPU 316 in FIG. 3 to realize the above operation in the second embodiment.

First, the CPU 316 reads out the maximum value $h_{max}$ of distortion compensation coefficient data from the LUT 302 (S701). Next, the CPU 316 performs a comparison to determine whether the obtained maximum value $h_{max}$ is larger than the upper limit α' or not (S702).

If the result of the judgment in S702 is YES ($h_{max} > α'$), the CPU 316 determines that the analog gain is decreasing. In this case, the CPU 316 calculates, as the control voltage to be supplied to the D/A converter 318 in FIG. 3, a new control voltage $V_{new}$ by adding a specified variation amount ΔV to the current control voltage $V_{current}$ and supplies the new control voltage $V_{new}$ to the D/A converter 318. That is, the CPU 316 controls the control voltage in the direction in which the gain of the VATT 317 in FIG. 3 increases (the attenuation amount decreases) (S703). Then the current gain adjustment process is terminated.

If the result of the judgment in S702 is NO ($h_{max} \le \alpha'$), the CPU 316 performs a comparison to determine whether the obtained maximum value $h_{max}$ is smaller than the lower limit $\beta'$ or not (S704).

If the result of the judgment in S704 is YES ($h_{max} \le \beta'$), the CPU 316 determines that the analog gain is too high. In this case, the CPU 316 calculates, as the control voltage to be supplied to the D/A converter 318 in FIG. 3, a new control voltage $V_{new}$ by subtracting a specified variation amount $\Delta V$ from the current control voltage $V_{current}$ and supplies the new control voltage $V_{new}$ to the D/A converter 318. That is, the CPU 316 controls the control voltage in the direction in which the gain of the VATT 317 in FIG. 3 decreases (the attenuation amount increases) (S705), Then the current gain adjustment process is terminated.

If the result of the judgment in S704 is NO ($h_{max} \ge \beta'$), the CPU 316 determines that the analog gain is appropriate. In this case, the CPU 316 terminates the current gain adjustment process without changing the control voltage.

In the above operation, in the same manner as in the first embodiment, the variation amount $\Delta V$ for the control voltage may be set as, for example, a value corresponding to a transmission output of about 0.1 dB, and as the timing for performing the above control operation, it may be performed at time intervals of several tens of seconds to several minutes.

Third Embodiment

The third embodiment has the configuration illustrated in FIG. 3 that is the same as that of the first embodiment.

The third embodiment is realized by the combination of the control operation of the first embodiment and the control operation of the second embodiment, and it is assumed that a distortion compensation characteristic as described in FIG. 4 is used. In the third embodiment, the CPU 316 monitors, in the LUT 302, both the average value of distortion compensation coefficients in the linear area illustrated as 405 in FIG. 4 and the maximum value of the distortion compensation coefficient values illustrated as 601 in FIG. 6. And the CPU 316 performs the control operation by combining the judgment as to whether the maximum value of the distortion compensation coefficients exceeds an upper-limit threshold value $\alpha'$ and the judgment as to whether the average value of the distortion compensation coefficients falls below a lower-limit threshold value $\beta$.

As a result, in a similar manner as in the first and second embodiments, the analog gain amount input to the power amplifier 307 is adjusted by the VATT 317, and the distortion compensation characteristic can be maintained as the characteristic illustrated as 401 in FIG. 4 without referring to the table with parameters with respect to temperature, frequency and the like. Thus a good distortion characteristic can be obtained even in the area with high input signal level illustrated as 401' in FIG. 4.

Figure 8:
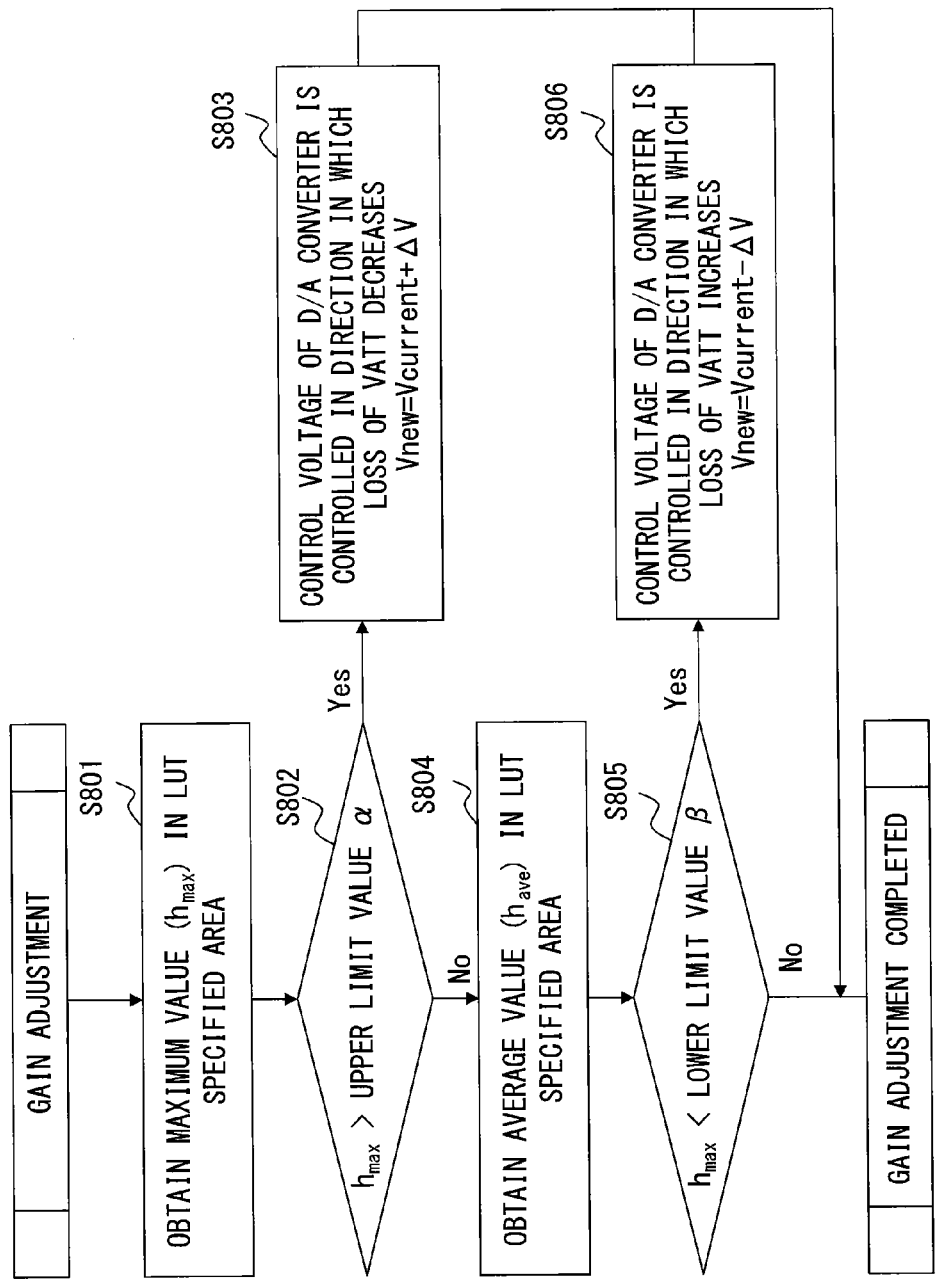
FIG. 8 is an operation flowchart of the third embodiment.

FIG. 8 is an operation flowchart of a program executed by the CPU 316 in FIG. 3 to realize the above operation in the third embodiment.

First, the CPU 316 reads out the maximum value $h_{max}$ of distortion compensation coefficient data from the LUT 302 (S801). Next, the CPU 316 performs a comparison to determine whether the obtained maximum value $h_{max}$ is larger than the upper limit $\alpha'$ or not (S802).

If the result of the judgment in S802 is YES ($h_{max} > \alpha'$), the CPU 316 determines that the analog gain is decreasing. In this case, the CPU 316 calculates, as the control voltage to be supplied to the D/A converter 318 in FIG. 3, a new control voltage $V_{new}$ by adding a specified variation amount $\Delta V$ to the current control voltage $V_{current}$ and supplies the new control voltage $V_{new}$ to the D/A converter 318. That is, the CPU 316 controls the control voltage in the direction in which the gain of the VATT 317 in FIG. 3 increases (the attenuation amount decreases) (S803). Then the current gain adjustment process is terminated.

If the result of the judgment in S802 is NO ($h_{max} \le \alpha'$), the CPU 316 reads out, from the LUT 302, distortion compensation coefficient data in the address range corresponding to a specified linear area illustrated as 405 in FIG. 4, and obtains the average value $h_{ave}$ in the range (S804).

Next, the CPU 316 performs a comparison to determine whether the obtained average value $h_{ave}$ is smaller than the lower limit $\beta$ or not (S805).

If the result of the judgment in S805 is YES ($h_{ave} < \beta$) the CPU 316 determines that the analog gain is too high. In this case, the CPU 316 calculates, as the control voltage to be supplied to the D/A converter 318 in FIG. 3, a new control voltage $V_{new}$ by subtracting a specified variation amount $\Delta V$ from the current control voltage $V_{current}$ and supplies the new control voltage $V_{new}$ to the D/A converter 318. That is, the CPU 316 controls the control voltage in the direction in which the gain of the VATT 317 in FIG. 3 decreases (the attenuation amount increases) (S806). Then the current gain adjustment process is terminated.

If the result of the judgment in S805 is NO ($h_{ave} \ge \beta$) the CPU 316 determines that the analog gain is appropriate, and terminates the current gain adjustment process without changing the control voltage.

Fourth Embodiment

Figure 9:
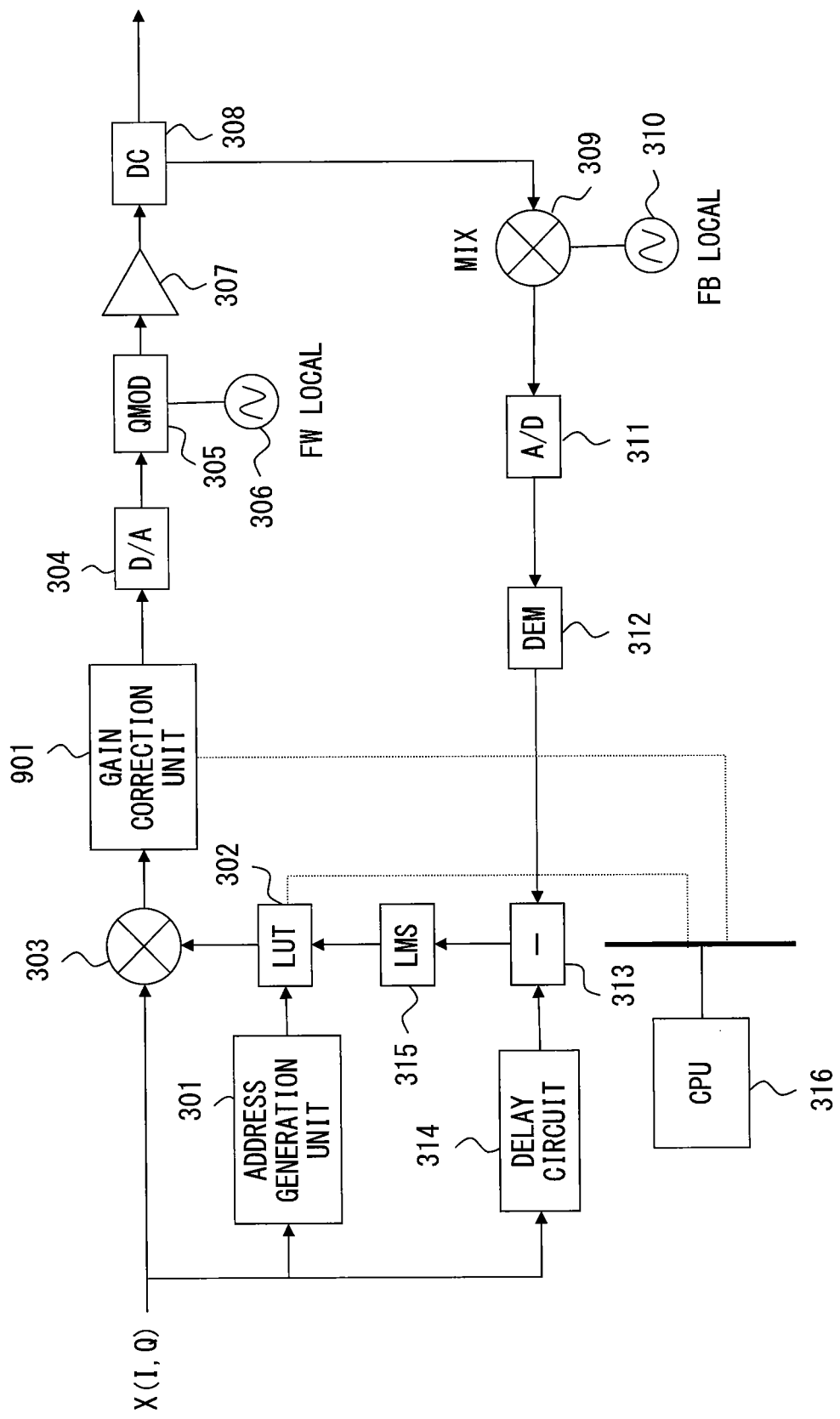
FIG. 9 is a configuration diagram of the fourth embodiment.

FIG. 9 is a configuration diagram of the fourth embodiment.

The configuration differs from the configuration of the first through third embodiments in that the gain correction is not performed by the VATT 317 (FIG. 3) inserted between the QMOD 305 and the power amplifier 307 but digitally performed by a gain correction unit 901 (FIG. 9) inserted between the multiplier 303 and the D/A converter 304.

In this case, the D/A converter 318 (FIG. 3) is not needed, and the CPU 316 can perform the control directly with a digital value for the gain correction unit 901 that is realized by, for example, a multiplier, making it possible to simply the circuit configuration.

The basic sequence of the control operation in this case is the same as the sequence in the operation flowcharts in FIG. 5, FIG. 7, FIG. 8 in the first through third embodiments described above. However, since the D/A converter 318 (FIG. 3) is not needed, the CPU 316 may calculate, not the control voltage, but the multiplier coefficient in the gain correction unit 901 that is a multiplier, directly. Also in this case, as processes corresponding to S503 and S505 in FIG. 5, S703 and S705 in FIG. 7, S803 and S806 in FIG. 8, control operations to increase or decrease the multiplier coefficient by a minimal value are performed.

According to the configuration described above, a good distortion compensation characteristic can be obtained in a prescribed range of the input signal level, even if there is a variation in the temperature, frequency of an analog transmission circuit, without monitoring the variation amount of the temperature, frequency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment (s) of the present inventions has(have) been described in detail, it should be understood that the various changes, substitutions, and alterations could be made hereto without departing from the spirit and scope of the invention.

What is claimed is:

1. A distortion compensation apparatus having a circuit configured to perform power amplification of a transmission signal; and a circuit configured to feedback the transmission signal output from the circuit configured to perform power amplification and obtain a demodulated signal of the transmission signal, while calculating and holding a distortion compensation coefficient with which an error between the demodulated signal and the transmission signal before the power amplification becomes minimum, to perform distortion compensation of the transmission signal based on the distortion compensation coefficient and provide the compensated transmission signal to the circuit configured to perform the power amplification, the distortion compensation apparatus comprising:
   a gain adjustment unit to adjust a gain of the transmission signal; and
   a gain control unit to adaptively adjust a gain of the gain adjustment unit based on the held distortion compensation coefficient, wherein
   the gain control unit controls the gain of the gain adjustment unit so that the held distortion compensation coefficient falls within a threshold value range.

2. The distortion compensation apparatus according to claim 1, wherein
   the gain control unit calculates an average value of the distortion compensation coefficients corresponding to a specified input level of the transmission signal in the held distortion compensation coefficients, and controls the gain of the gain adjustment unit so that the average value falls within a threshold value range.

3. The distortion compensation apparatus according to claim 1, wherein
   the gain control unit calculates a maximum value of the held distortion compensation coefficients, and controls the gain of the gain adjustment unit so that the maximum value falls within a threshold value range.

4. The distortion compensation apparatus according to claim 1, wherein
   the gain control unit calculates an average value of the distortion compensation coefficients corresponding to a specified input level of the transmission signal in the held distortion compensation coefficients and a maximum value of the held distortion compensation coefficients, and controls the gain of the gain adjustment unit so that the average value and the maximum value fall within a threshold value range.

5. The distortion compensation apparatus according to claim 1, wherein
   the gain adjustment unit is a variable attenuator configured to adjust a gain of the transmission signal at an analog stage; and
   the gain control unit comprises
     a controller to calculate a control voltage digital signal for controlling a gain of the variable attenuator, and
     a D/A converter to convert the control voltage digital signal into a control voltage analog signal to be supplied to the variable attenuator.

6. The distortion compensation apparatus according to claim 1, wherein
   the gain control unit is a multiplier configured to adjust a gain of the transmission signal at a digital stage; and
   the gain control unit calculates a multiplier coefficient in the multiplier to be supplied to the multiplier with reference to the held compensation coefficient.

7. A distortion compensation method for performing power amplification of a transmission signal; feeding back the transmission signal and obtaining a demodulated signal of the transmission signal, and while calculating and holding a distortion compensation coefficient with which an error between the demodulated signal and the transmission signal before the power amplification becomes minimum, performing distortion compensation of the transmission signal based on of the distortion compensation coefficient and providing the compensated transmission signal to a circuit configured to perform the power amplification, the distortion compensation method comprising:
   adjusting a gain of the transmission signal in a first process; and
   adaptively controlling the gain of the first process based on the held compensation coefficient in a second process, wherein
   the gain of the first process is adaptively controlled in the second process so that the held distortion compensation coefficient falls within a threshold value range.

8. The distortion compensation method according to claim 7, wherein
   an average value of distortion compensation coefficients corresponding to a specified input level of the transmission signal in the held distortion compensation coefficients is calculated, and the gain of the first process is adaptively controlled so that the average value falls within a threshold value range in the second process.

9. The distortion compensation method according to claim 7, wherein
   a maximum value of the held distortion compensation coefficients is calculated, and the gain of the first process is adaptively controlled so that the maximum value falls within a threshold value range in the second process.

10. The distortion compensation method according to claim 7, wherein
    an average value of distortion compensation coefficients corresponding to a specified input level of the transmission signal in the held distortion compensation coefficients and a maximum value of the held distortion compensation coefficients are calculated, and the gain of the first process is adaptively controlled so that the average value and the maximum value fall within a threshold value range in the second process.

* * * * *